(12) United States Patent
Campagna

(10) Patent No.: US 10,073,157 B2
(45) Date of Patent: Sep. 11, 2018

(54) DEVICE, METHOD AND SYSTEM TO CONTROL IMAGING METHODS AND SYSTEMS

(71) Applicant: Swen Campagna, Engelthal (DE)

(72) Inventor: Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 1142 days.

(21) Appl. No.: 14/018,730

(22) Filed: Sep. 5, 2013

(65) Prior Publication Data
US 2014/0067310 A1    Mar. 6, 2014

(30) Foreign Application Priority Data
Sep. 5, 2012   (DE) ........................ 10 2012 215 722

(51) Int. Cl.
*G01L 15/00*   (2006.01)
*G01R 33/54*   (2006.01)
*G06F 11/30*   (2006.01)

(52) U.S. Cl.
CPC ................. *G01R 33/543* (2013.01)

(58) Field of Classification Search
CPC .................................................... G01R 33/543
See application file for complete search history.

(56) References Cited

U.S. PATENT DOCUMENTS

2008/0108891 A1\* 5/2008 Campagna ............ A61B 5/055
600/410

\* cited by examiner

*Primary Examiner* — Phuong Huynh
(74) *Attorney, Agent, or Firm* — Schiff Hardin LLP

(57) ABSTRACT

A computer-implemented method for operating an imaging system, includes in a processor, receiving a measurement task, generating a description of the measurement task in the processor from a sequence accessed by the processor, translating the generated description into instructions, and executing the instructions in an imaging installation of the system. An imaging system is configured to execute such a method, and a non-transitory, computer-readable data storage medium is encoded with programming instructions that cause the method to be executed.

5 Claims, 4 Drawing Sheets

DEVICE, METHOD AND SYSTEM TO CONTROL IMAGING METHODS AND SYSTEMS

BACKGROUND OF THE INVENTION

Field of the Invention

The present invention is in the fields of medical engineering and information technology and in particular concerns control of imaging methods and systems, for example diagnostic magnetic resonance (MR) methods and MR systems, or other installations.

Description of the Prior Art

The diagnostic MR system 10 that is schematically shown in FIG. 1 has four layers: an MR measurement console 100, an MR measurement monitoring computer 200, an MR controller 300, and an MR data acquisition unit (MR scanner) 400.

The MR measurement console 100 has a communication interface 105, a processor 110 and memory 120. The memory 120 stores an operating system 130 and an application program 140. The MR measurement console 100 can, for example, be executed as a desktop computer 101 or notebook computer. The MR measurement console 100 serves for interaction of a user with the MR system 10, for example to plan an examination of a patient by means of the MR system 10 and to receive a parameterized measurement task. The MR measurement console 100 does not need to satisfy any real-time requirements, and the operating system does not need to be a real-time operating system (and is a version of Windows® from the company Microsoft, for example).

The MR measurement monitoring computer 200 has two communication interfaces $205_1$, $205_2$, a processor 210 and memory 220. The memory stores a real-time operating system 235, an application program 240 and a sequence 250. The MR measurement monitoring computer 200 can be executed as a powerful workstation 202, for example. With its communication interface $205_1$, the MR measurement monitoring computer 200 is connected via a connection 610 with the communication interface 105 of the MR measurement console 100 and serves for processing and execution of the measurement task that is transferred from the measurement console 100 to the MR measurement monitoring computer 200 via the connection 610. For this, the MR measurement monitoring computer 20 loads the sequence 250 in the form of a freely programmable binary program and executes it in order to promptly generate instructions for the MR system 400 with an actual execution point in time, which instructions are transferred to the MR controller 300. The MR measurement monitoring computer 200 must therefore satisfy real-time requirements on the order of one millisecond (ms) or shorter (soft real-time response), and the operating system must thus be a real-time operating system 235. The MR measurement monitoring computer 200 can be executed as a computer, for example a measurement and control computer (measurement and reconstruction computer) or a measurement and control system (measurement and reconstruction system).

The MR controller 300 has a communication interface 305 and n components $360_1$-$360_n$ with communication interfaces $365_1$-$365_n$. The components $360_1$-$360_n$ translate the instructions and serve for general communication tasks, to control gradients of a gradient arrangement (gradient array), to control a transmitter unit (TX unit) and to process radio-frequency signals in the transmission unit or to control a receiver unit (RX unit) and to digitize radio-frequency (RF) reception signals in the receiver unit. For example, the n components $360_1$-$360_n$ can include digital signal processors (DSPs) or (application) field programmable (logic) gate arrays (FPGAs). With its communication interface 305, the MR controller 300 is connected via a connection 620 with the communication interface $205_2$ of the MR measurement monitoring computer 200 and serves to translate the instructions that are transferred from the MR measurement monitoring computer 200 and need to be executed exactly at a desired or, respectively, required point in time. The MR controller 300 therefore must satisfy real-time requirements on the order of one nanosecond (ns) or shorter (hard real-time). The MR controller 300 can be executed as a distributed controller, wherein given a distributed control the communication interface 305 can comprise multiple physical interfaces, for example if sub-components are spatially separated.

The MR installation/the MR scanner 400 has n devices $460_1$-$460_n$ (for example the gradient array with gradient amplifier and the gradient coils, the transmitter unit with radio-frequency amplifier and radio-frequency coil, and the receiver unit) with n communication interfaces $465_1$-$465_n$ that are connected via connections $630_1$-$630_n$ with the communication interfaces $365_1$-$365_n$ of the n components $360_1$-$360_n$, and is controlled by the MR controller 300.

In operation of the MR system 10, the measurement workflow is controlled during the examination via the sequence that exactly establishes the points in time of gradient activity, radio-frequency pulses and measurements. Events (for example in the form of physiological signals) can thereby be reacted to dynamically, and the measurement workflow can be adapted accordingly.

In the simplest case, the sequence can be described in the form of a table (for example a static table) created once, this table simply being executed in the operation of the MR system 10.

Alternatively, in an improved version, the sequence can be realized in the form of an executable program that is freely programmed in advance by the manufacturer of the MR system 10, or by interested researchers in a computer language (for example a high-level computer language such as C or C++), and is executed by the measurement monitoring computer 200 in the operation of the MR system 10.

In such known systems, it is thus necessary to execute the sequence in the form of an executable program in a freely programmable measurement monitoring computer 200 with real-time requirements (since the instructions for the MR installation 400 must be generated promptly).

In the MR system 10 according to the prior art, the real-time requirements of the measurement monitoring computer 200 are disadvantageous.

SUMMARY OF THE INVENTION

An object of the present invention is to provide improved MR system that is improved with regard to the aforementioned disadvantage.

In the following the achievement of the object is described with reference to a control device for an imaging system. Features, advantages and/or alternative embodiments thereof are also applicable to the method, the system, and the computer-readable storage medium that are also encompassed by the invention. The corresponding functional features of the device are thereby formed by corresponding objective computer-implemented modules, in particular microprocessor modules of the system. The device, the method and the system can also be integrated as embedded systems into the controller or the MR system.

The terms used herein are explained in detail in the following.

An imaging or image processing system is a system (preferably an electronic and/or information technology system) to acquire, process, evaluate and/or store image information in the form of image data. For example, acoustic methods such as ultrasound (US); emission methods such as emission computer tomography (ECT) and positron emission tomography (PET); optical methods; radiological methods such as x-ray tomography and computed tomography (CT), magnetic resonance tomography (MR), or combined methods, can be used to acquire image information. The image processing system can supply 2-dimensional (2D) or multidimensional—such as 3-dimensional (3D) or 4-dimensional (4D)—image data that are advantageously stored and/or can be processed in different formats. The image processing system can be used in diagnostics, for example in medical diagnostics.

A processor (central processing unit, CPU) is, for example, a microprocessor or digital signal processor (DSP). The processor—which is controlled by the program, which can be divided up into a plurality of program modules—writes data into the memory, reads data from the memory and processes the data. The processor can also be executed as an (application) field programmable (logic) gate array (FPGA), for example.

For example, the storage medium can be a read-only memory (ROM) such as an electrically erasable programmable read-only memory (EEPROM) or Flash EEPROM in a read/write memory (random access memory, RAM), or disk storage, such as a hard drive. The storage medium can be used to store a program (for example an operating system and/or an application program) and/or data (in particular image data, instruction data, configuration data, parameter data, protocol data and sequence data).

An operating system includes computer programs that administer system resources (hardware components) of a computer—for example memory such as working memory and hard disks), input and output devices such as interfaces—and provides application programs. The operating system thus forms an interface between the system resources and the application programs.

A real-time operating system (RTOS) is an operating system with additional real-time functions for the absolute compliance with time conditions and the predictability of the process response. The real-time operating system must satisfy the quantitative real-time requirements that are placed on it: given soft real-time requirements, all arriving inputs are typically executed fast enough; and given hard real-time requirements, exceeding the response time is assessed as an error.

One aspect of the invention concerns a computer-implemented method for operating an imaging system, including receiving a measurement task, generating a description of the measurement task from a sequence, translating the generated description into instructions, and executing the instructions in an imaging installation (data acquisition installation) of the system.

Through this aspect of the invention, the risk of a measurement termination due to missing instructions is reduced, since the sequence (in the form of an executable, freely programmable program) is decoupled from the real-time requirements, and thus a sufficient number of instructions for the MR system are provided depending on the system. Furthermore, the equipment, the cost and the design of the computer for execution of the executable, freely programmable program can be reduced (for example with regard to computing power) relative to the known measurement monitoring computer. Moreover, the flexibility of the computer is increased relative to the known measurement monitoring computer. For example, the computer can be designed as a virtual machine (VM) and/or be outsourced to a server or the cloud with other computers.

A further aspect of the invention concerns a method wherein the generation of the description takes place under non-real-time requirements.

A further aspect of the invention concerns a method wherein the description includes information (for example in the form of information technology data) regarding a radio-frequency signal (such as a radio-frequency pulse) in a transmission unit of the installation, the activity of a gradient coil in a gradient array of the installation, and/or for workflow monitoring or flow monitoring, for example in the form of a control structure such as a condition, loop or branch. The description may include information pertaining to an event, for example a dynamic event that is detected depending on a signal that is detected by a physiological measurement device of the installation. The description may include information setting a parameter, for example a parameter of the transmitter unit, the gradient array or a receiver unit; a counter, for example a loop counter. The description may be any combination of the above examples.

A further aspect of the invention concerns a corresponding device, for example a control device.

A further aspect of the invention concerns a corresponding system, for example a control system.

The present invention also encompasses a non-transitory, computer-readable data storage medium encoded with programming instructions that, when the storage medium is loaded into a control computer of an imaging system, cause the imaging system to execute the above-described method.

It is within the scope of the invention to not necessarily execute the method steps in the order described in the preceding. Instead of relaying the information coming from the transmitting components directly to the receiving components, it is alternatively also possible, for example, to first conclude the reception of the information from the transmitting component and to only then send the information the receiving component. In a further embodiment, the method steps can be interleaved with one another.

Moreover, it is possible for individual segments of the method described in the preceding can be designed as individual, salable units, and that the remaining sections of the method can be designed as other salable units. The method according to the invention can therefore be executed as a distributed system at different computer-based instances (for example client/server instances). For example, it is thus possible that a module for its part comprises different sub-modules that, for example, are implemented in part at the measurement system, in part at the reconstruction system and/or in part at other computer-based instances.

DESCRIPTION OF THE PREFERRED EMBODIMENTS

Figure 1:
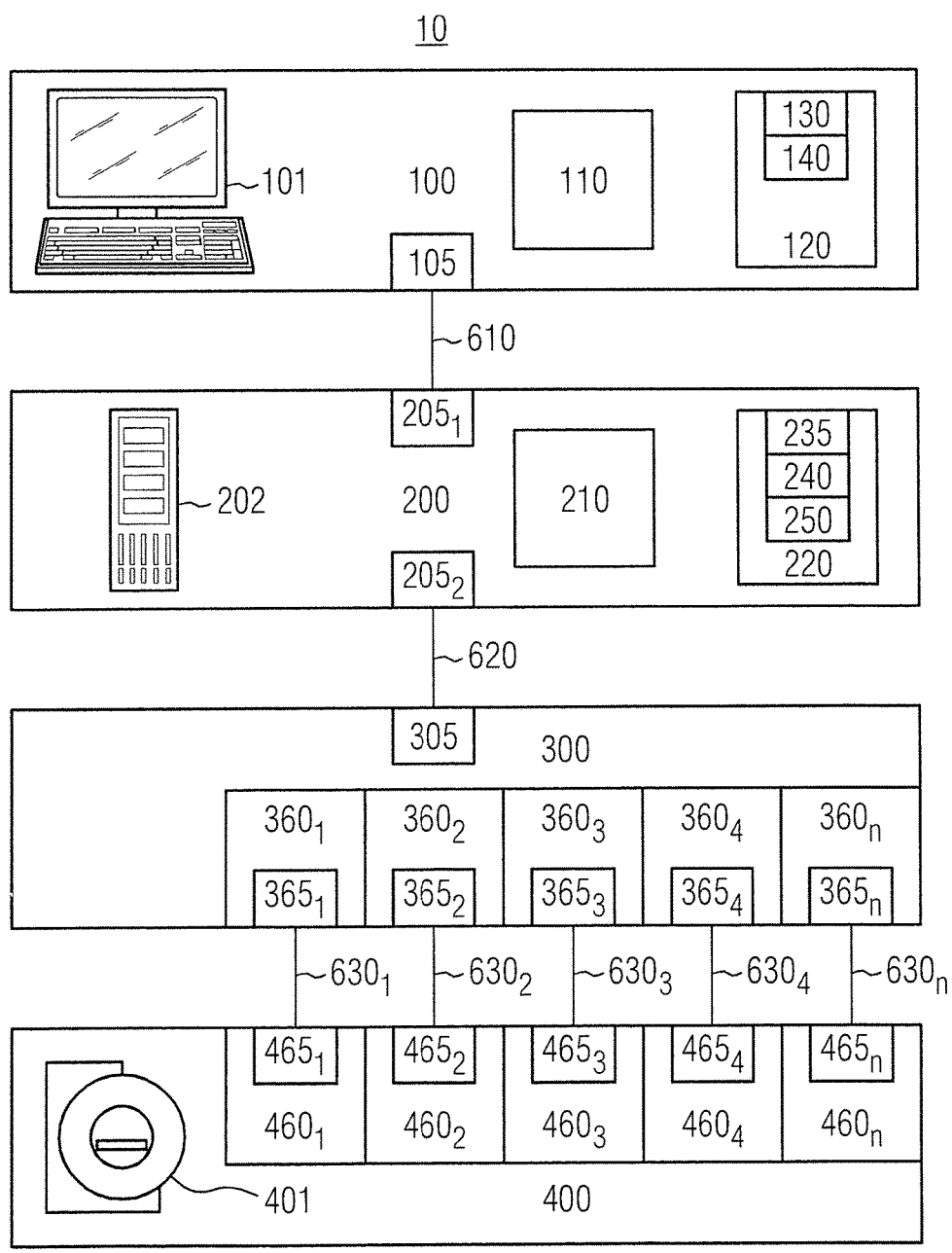
FIG. 1 is a schematic representation of a known MR system.
Figure 2:
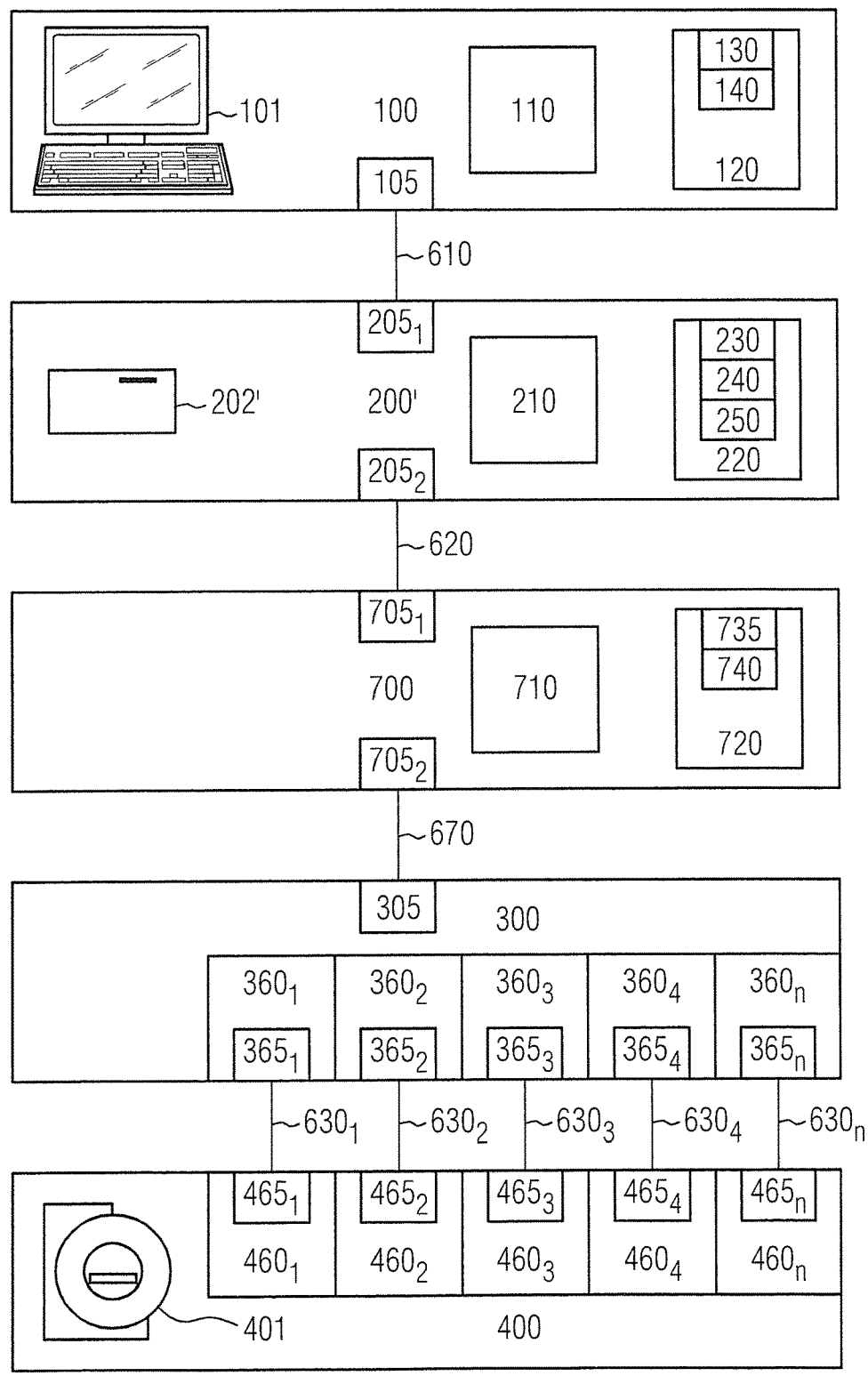
FIG. 2 is a schematic representation of an MR system according to a preferred embodiment of the invention.

FIG. 2 shows a schematic representation of an MR system 20 according to a preferred embodiment of the invention, comprising five layers: an MR measurement console 100, an MR measurement monitoring computer 200', an MR measurement interpreter 700, an MR controller 300 and an MR installation or, respectively, an MR scanner 400.

The MR measurement console 100 includes a communication interface 105, a processor 110 and memory 120. The memory 120 stores an operating system 130 and an application program 140. The MR measurement console 100 can be executed as a desktop computer 101 or notebook computer, for example. The MR measurement console 100 serves for interaction of a user with the MR system 20, for example to plan an examination of a patient by means of the MR system 20 and to receive a parameterized measurement task. For interaction with the user, the MR measurement console 100 has a user interface, for example a graphical user interface (GUI). The MR measurement console 100 does not need to satisfy any real-time requirements, and the operating system does not need to be a real-time operating system and is, for example, a version of Windows® from the company Microsoft.

The MR measurement monitoring computer 200' has two communication interfaces $205_1$, $205_2$, a processor 210 and memory 220. The memory 220 stores an operating system 230, an application program 240 and a sequence 250. The MR measurement monitoring computer 200' can be executed as a desktop computer 202' or virtual machine, for example. With its communication interface $205_1$, the MR measurement monitoring computer 200' is connected via a connection 610 with the communication interface 105 of the MR measurement console 100 and serves to process and execute the measurement task that is transferred from the measurement console 100 via the connection 610 to the MR measurement monitoring computer 200'.

For this purpose, the MR measurement monitoring computer 200' loads the sequence 250 (for example in the form of a freely programmable binary program) and generates a description of the measurement task from the sequence 250. The description is preferably a detailed and/or complete description of the entire measurement. For example, the description includes information with regard to radio-frequency signals, such as radio-frequency pulses in the transmission unit and activities of gradients in the gradient array. The description furthermore includes information regarding workflow monitoring or flow monitoring, for example in the form of control structures such as conditions, loops and branches. The description thus supports the flexibility of the underlying sequence. The description can furthermore include information regarding events (for example dynamic events). A branching can thus be controlled depending on an event. For example, the event can be triggered depending on a signal that is detected by a physiological measurement unit (PMU). Furthermore, the description can include parameters (for example parameters of the transmission unit, gradient array or receiver unit). For example, parameters of gradient activities can be controlled within a loop. Furthermore, the description can include counters, for example loop counters. The description is thus so comprehensive that it can completely describe the sequence.

The MR measurement monitoring computer 200' can generate the description for the complete measurement task unitarily as a whole, for example before the execution of the measurement task. Alternatively, the MR measurement monitoring computer 200' can generate the description for the measurement task bit by bit so that the requirements can be on the order of one second (s) or longer.

The MR measurement monitoring computer 200' therefore does not need to satisfy any real-time requirements, and the operating system 230 thus does not need to be a real-time operating system. The MR measurement monitoring computer 200' can be executed as a computer, for example a measurement and control computer (measurement and reconstruction computer) or, respectively, measurement and control system (measurement and reconstruction system).

For example, the MR measurement interpreter 700 has two communication interfaces $705_1$, $705_2$, a processor 710 and memory 720. For example, the memory 720 stores a real-time operating system 735 and an application program 740. For example, with its communication interface $705_1$ the MR measurement interpreter 700 is connected via a connection 620 with the communication interface $205_2$ of the MR measurement monitoring computer 200' and serves for prompt translation of the description (that is transferred by the measurement monitoring computer 200' to the MR measurement interpreter 700 via the connection 620) in order to promptly generate instructions for the MR installation 400 with an actual execution point in time, which instructions are transferred to the MR controller 300.

Although the description is powerful, the MR measurement interpreter 700 can translate it into the instructions with less resources since the translation is accomplished without the sequence in the form of the binary program and the description is self-contained.

Although the MR measurement interpreter 700 must satisfy real-time requirements on the order of one millisecond (ms) or shorter (soft real-time response) and the operating system must thus be a real-time operating system 235, fewer resources are thus sufficient for the translation of the description into instructions than for the generation of the instructions directly from the sequence in the form of the binary program.

The MR controller 300 has a communication interface 305 and n components $360_1$-$360_n$ with communication interfaces $365_1$-$365_n$. The components $360_1$-$360_n$ translate the instructions and, for example, serve for general communication tasks, to control gradients of a gradient array to control a transmitter unit (TX unit) and to process radio-frequency signals in the transmission unit or to control a receiver unit (RX unit) and to digitize radio-frequency (RF) reception signals in the receiver unit. For example, the n components $360_1$-$360_n$ can include digital signal processors (DSPs) or (application) field programmable (logic) gate arrays (FPGAs). With its communication interface 305, the MR controller 300 is connected via a connection 670 with the communication interface $705_2$ of the MR measurement interpreter 700 and serves to translate the instructions that are transferred from the MR measurement interpreter 700 and need to be executed exactly at a desired or, respectively, required point in time. The MR controller 300 therefore must satisfy real-time requirements on the order of one nanosecond (ns) or shorter (hard real-time). The MR controller 300 can be executed as a distributed controller, wherein given a distributed control the communication interface 305 can comprise multiple physical interfaces, for example if sub-components are spatially separated.

The MR installation/the MR scanner 400 comprises n devices 460₁-460ₙ (for example the gradient array with gradient amplifier and the gradients, the transmitter unit with radio-frequency amplifier and radio-frequency coil and the receiver unit) with n communication interfaces 465₁-465ₙ that are connected via connections 630₁-630ₙ with the communication interfaces 365₁-365ₙ of the n components 360₁-360ₙ, and is controlled by the MR controller 300.

In operation of the MR system 20, the measurement workflow is controlled during the examination via the sequence that exactly establishes the points in time of gradient activity, radio-frequency pulses and measurements. Events (for example in the form of physiological signals) can thereby be reacted to dynamically, and the measurement workflow can be adapted accordingly.

Due to the intermediate step, the complexity of the programming of the sequence in the MR measurement monitoring computer 200' and the real-time requirement thereby remains outsourced to the MR measurement interpreter 700.

Furthermore, the sequence can thus be realized in the form of an executable program that is freely programmed in advance by the manufacturer of the MR system 0 [sic] or also by interested researchers in a computer language (for example a high-level computer language such as C or C++) and can then be executed by the measurement monitoring computer 200 in the operation of the MR system 20.

Figure 3:
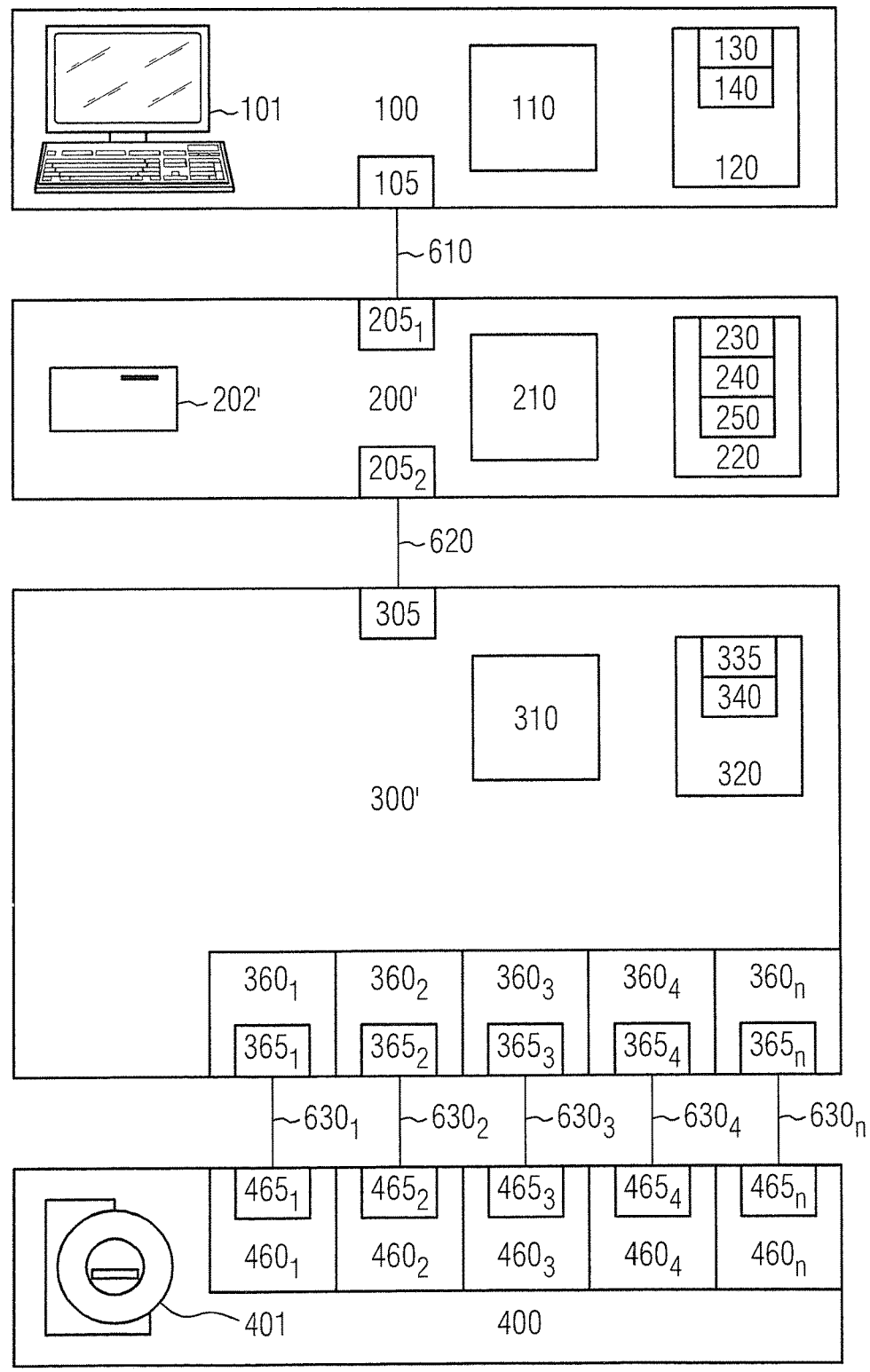
FIG. 3 is a schematic representation of an MR system according to a further embodiment of the invention.

FIG. 3 is a schematic representation of an MR system 30 according to a further embodiment of the invention, comprising four layers: an MR measurement console 100, an MR measurement monitoring computer 200', an MR controller 300' and an MR installation or, respectively, an MR scanner 400.

For example, here the MR controller 300' furthermore has a processor 310 and memory 320. For example, the memory 320 stores a real-time operating system 335 and an application program 340. For example, with its communication interface 305 the MR controller 300' is connected via a connection 620 with the communication interface 205₂ of the MR measurement monitoring computer 200' and (as described with reference to FIG. 2) serves for prompt translation of the description that is transferred from the MR measurement monitoring computer 200' to the MR controller 300' via the connection 620 in order to generate instructions for the MR installation 400 itself promptly with an actual execution point in time.

Figure 4:
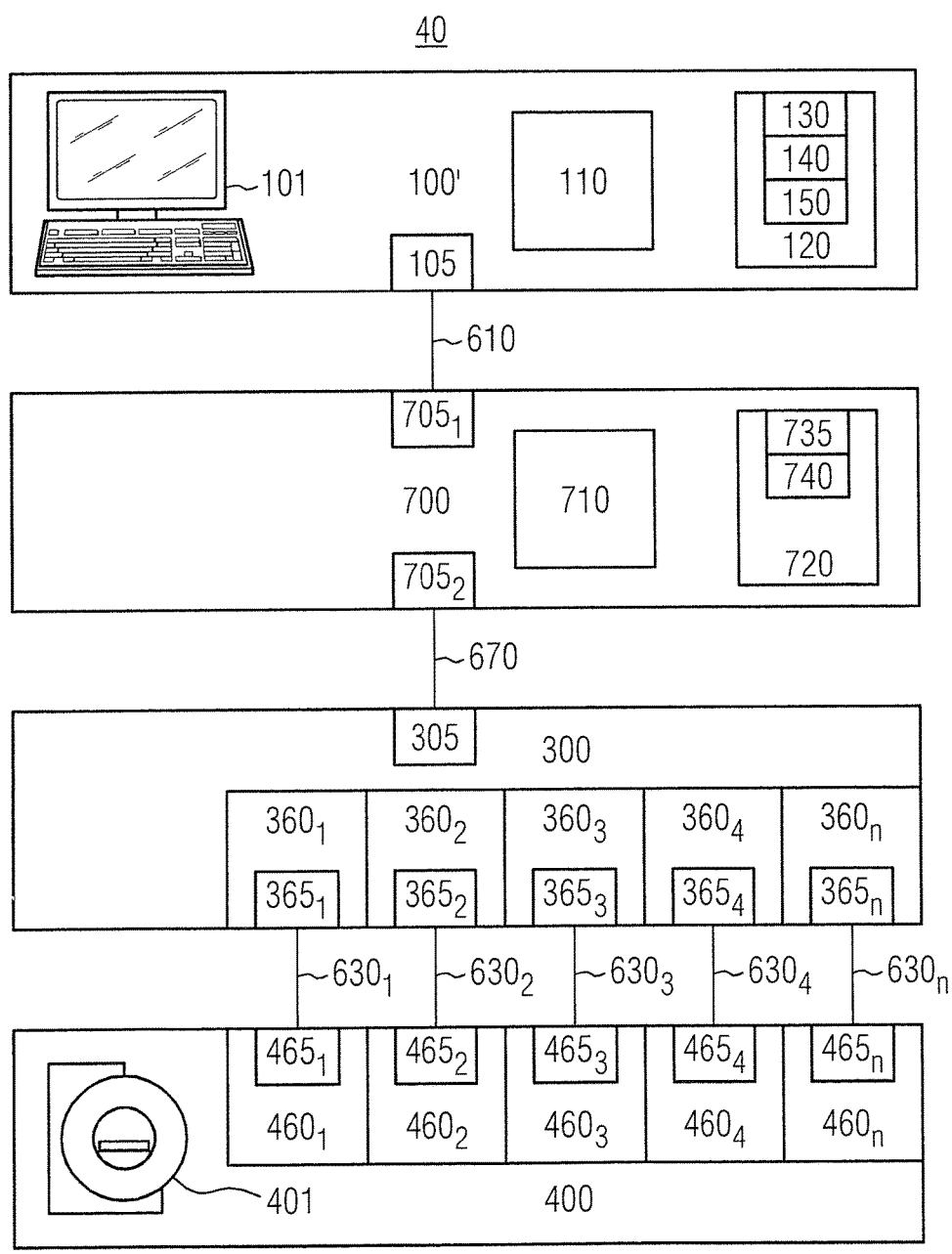
FIG. 4 is a schematic representation of an MR system according to a further embodiment of the invention.

FIG. 4 is a schematic representation of an MR system 40 according to a further embodiment of the invention, comprising four layers: an MR measurement console 100', an MR measurement interpreter 700, an MR controller 300 and an MR installation or, respectively, an MR scanner 400.

Here the memory 120 of the MR measurement console 100' furthermore stores the sequence 150. As described with reference to FIG. 2, the MR measurement console 100' loads the sequence 150 from the memory 120 and generates the description of the measurement task from the sequence 150.

With its communication interface 705₁, the MR measurement interpreter 700 is connected via a connection 610 with the communication interface 105 of the MR measurement console 100'.

Since the generation of the description does not necessitate any real-time requirements, it can be executed in the MR measurement console 100'. Alternatively, the generation of the description can be outsourced to a virtual machine, with other computers at a server or in the cloud, for example.

A further embodiment of the invention (not shown) has three layers: an MR measurement console 100', an MR controller 300' and an MR installation or, respectively, an MR scanner 400.

Here—as described with reference to FIG. 4—the MR measurement console 100' loads the sequence 150 from the memory 120 and generates the description of the measurement task from the sequence 150, and the MR controller 300' serves—as described with reference to FIG. 3—for prompt translation of the description that is transferred from the MR measurement console 100' to the MR controller 300' via the connection 610 in order to generate instructions for the MR installation 400 itself promptly with an actual execution point in time.

Although modifications and changes may be suggested by those skilled in the art, it is the intention of the inventor to embody within the patent warranted hereon all changes and modifications as reasonably and properly come within the scope of his contribution to the art.

I claim as my invention:

1. A computerized method for operating an imaging system, comprising:
    entering a measurement task into a computerized processor;
    in said computerized processor, automatically generating an electronic description of the measurement task from a sequence accessed by said processor;
    in a measurement interpreter that satisfies real-time requirements and that is in communication with said processor, translating the generated description of the measurement task into computer-executable instructions under said real-time requirements, thereby relieving said processor from having to satisfy real-time requirements; and
    transferring said instructions to components of an imaging installation and executing said instructions in the respective components to generate an image of a subject in said imaging installation.

2. A method as claimed in claim 1 comprising generating said description to include information selected from the group consisting of a radio-frequency signal to be generated by a radio-frequency transmitter in a magnetic resonance imaging installation, a pattern of a gradient field to be generated by a gradient coil array of a magnetic resonance imaging installation, flow monitoring of execution of said instructions, a dynamic event that is detected by a physiological measurement device as one of said components, a parameter defining operation of at least one of said components, and a loop counter.

3. A control system of an imaging system, comprising:
    a measurement console configured to receive a measurement task as an input;
    a measurement monitoring computer configured to generate an electronic description of the measurement task from a sequence accessed by said computer;
    a measurement interpreter that satisfies real-time requirements and that is in communication with said processor, configured to translate the generated description into computer-executable instructions under said real-time requirements, thereby relieving said processor from having to satisfy real-time requirements; and
    a controller in communication with components of an imaging system, configured to translate said instructions and to operate the respective components of said imaging system according to said instructions in order to generate an image of a subject in the imaging system.

4. A control system as claimed in claim 3 wherein said measurement monitoring computer is configured to generate said description to include at least one item selected from the group consisting of a radio-frequency signal to be generated by a radio-frequency transmitter in a magnetic resonance imaging installation, a pattern of a gradient field to be generated by a gradient coil array of a magnetic resonance imaging installation, flow monitoring of execution of said instructions, a dynamic event that is detected by a physiological measurement device as one of said components, a parameter defining operation of at least one of said components, and a loop counter.

5. A non-transitory, computer-readable data storage medium encoded with programming instructions, said storage medium being loadable into a computerized processing system, and said programming instructions causing said processing system to:

receive a measurement task as an input;

access a sequence by a processor and generate an electronic description in said processor of the measurement task from said sequence;

in a measurement interpreter that satisfies real-time requirements and that is in communication with said processor, configured to translate the generated description into computer-executable instructions under said real-time requirements, thereby relieving said processor from having to satisfy real-time requirements; and operate components of an imaging system according to said instructions in order to generate an image of a subject in the imaging system.

* * * * *